(12) United States Patent
Kumazawa

(10) Patent No.: US 9,705,510 B2
(45) Date of Patent: Jul. 11, 2017

(54) CDR CONTROL CIRCUIT, CDR CIRCUIT, AND CDR CONTROL METHOD

(71) Applicant: SOCIONEXT INC., Yokohama-shi, Kanagawa (JP)

(72) Inventor: Makoto Kumazawa, Kasugai (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/143,080

(22) Filed: Apr. 29, 2016

(65) Prior Publication Data

US 2016/0380638 A1 Dec. 29, 2016

(30) Foreign Application Priority Data

Jun. 26, 2015 (JP) .................................. 2015-129087

(51) Int. Cl.

| H03L 7/08 | (2006.01) |
|---|---|
| H03L 7/091 | (2006.01) |
| H03K 5/135 | (2006.01) |
| H03L 7/081 | (2006.01) |
| H03L 7/093 | (2006.01) |
| H04L 7/033 | (2006.01) |
| H03M 9/00 | (2006.01) |

(52) U.S. Cl.
CPC ........... *H03L 7/0807* (2013.01); *H03K 5/135* (2013.01); *H03L 7/0814* (2013.01); *H03L 7/091* (2013.01); *H03L 7/093* (2013.01); *H04L 7/033* (2013.01); *H03M 9/00* (2013.01)

(58) Field of Classification Search
CPC ..... H03L 7/0807; H03L 7/0812; H03L 7/091; H03L 7/07; H03L 7/0814; H03L 7/093; H03M 9/00; H03K 5/135; H04L 7/033
See application file for complete search history.

(56) References Cited

U.S. PATENT DOCUMENTS

| 2003/0214335 A1* | 11/2003 | Saeki ...................... H03K 5/133 327/165 |
|---|---|---|
| 2004/0202266 A1* | 10/2004 | Gregorius ................ H03L 7/07 375/355 |
| 2006/0076993 A1* | 4/2006 | Teo .......................... H03K 5/13 327/165 |
| 2011/0064176 A1* | 3/2011 | Takada ..................... H03L 7/07 375/355 |

(Continued)

FOREIGN PATENT DOCUMENTS

| JP | 2010-206735 A | 9/2010 |
|---|---|---|
| JP | 2012-205204 A | 10/2012 |
| JP | 2014-171238 A | 9/2014 |

*Primary Examiner* — Syed Haider
(74) *Attorney, Agent, or Firm* — Arent Fox LLP

(57) ABSTRACT

A CDR control circuit detects a phase shift of input data that is taken in with a phase-adjusted clock, and generates phase control data that controls the phase of the clock based on the detected phase shift, the CDR control circuit includes a change detection circuit that detects an over-change in the phase shift; and a selection circuit that outputs the phase shift before the change, which is the phase shift before the time of detection of the over-change, as the phase shift for a predetermined period of time at the time of detection of the over-change, wherein during the predetermined period of time, the phase control data is generated based on the phase shift before change.

10 Claims, 19 Drawing Sheets

(56) References Cited

U.S. PATENT DOCUMENTS

2011/0216863 A1* 9/2011 Tomita .................... H04L 7/00
 375/371
2012/0039426 A1* 2/2012 Onodera ................ H04L 7/002
 375/355

* cited by examiner

FIG. 5

| DL LATCHED DATA<br>Dm,Bm-1,Dm-1,Bm-2,Dm-2 | SECOND HALF<br>Dm,Bm-1,Dm-1 | FIRST HALF<br>Dm-1,Bm-2,Dm-2 | TOTAL OF ADVANCE/ DELAY |
|---|---|---|---|
| 10011 | -1 | -1 | 110; |
| 01100 | -1 | -1 | 110; |
| 10001 | -1 | 1 | 000; |
| 01110 | -1 | 1 | 000; |
| 11011 | 1 | -1 | 000; |
| 00100 | 1 | -1 | 000; |
| 11001 | 1 | 1 | 010; |
| 00110 | 1 | 1 | 010; |
| 11100 | 0 | -1 | 111; |
| 00011 | 0 | -1 | 111; |
| 11110 | 0 | 1 | 001; |
| 00001 | 0 | 1 | 001; |
| 10000 | -1 | 0 | 111; |
| 01111 | -1 | 0 | 111; |
| 11000 | 1 | 0 | 001; |
| 00111 | 1 | 0 | 001; |
| 11111 | 0 | 0 | 000; |
| 00000 | 0 | 0 | 000; |

FIG. 8

| No | PREG[5:0] | O_PICODED[10:0] | No. | PREG[5:0] | O_PICODED[8:0] |
|---|---|---|---|---|---|
| 0 | 000000 | 000_0000_0000 | 32 | 100000 | 110_0000_0000 |
| 1 | 000001 | 000_0000_0001 | 33 | 100001 | 110_0000_0001 |
| 2 | 000010 | 000_0000_0010 | 34 | 100010 | 110_0000_0010 |
| 3 | 000011 | 000_0000_0011 | 35 | 100011 | 110_0000_0011 |
| 4 | 000100 | 000_0000_0110 | 36 | 100100 | 110_0000_0110 |
| 5 | 000101 | 000_0000_0111 | 37 | 100101 | 110_0000_0111 |
| 6 | 000110 | 000_0000_1110 | 38 | 100110 | 110_0000_1110 |
| 7 | 000111 | 000_0000_1111 | 39 | 100111 | 110_0000_1111 |
| 8 | 001000 | 000_0001_1110 | 40 | 101000 | 110_0001_1110 |
| 9 | 001001 | 000_0001_1111 | 41 | 101001 | 110_0001_1111 |
| 10 | 001010 | 000_0011_1110 | 42 | 101010 | 110_0011_1110 |
| 11 | 001011 | 000_0011_1111 | 43 | 101011 | 110_0011_1111 |
| 12 | 001100 | 000_0111_1110 | 44 | 101100 | 110_0111_1110 |
| 13 | 001101 | 000_0111_1111 | 45 | 101101 | 110_0111_1111 |
| 14 | 001110 | 000_1111_1110 | 46 | 101110 | 110_1111_1110 |
| 15 | 001111 | 000_1111_1111 | 47 | 101111 | 110_1111_1111 |
| 16 | 010000 | 101_1111_1111 | 48 | 110000 | 011_1111_1111 |
| 17 | 010001 | 100_1111_1111 | 49 | 110001 | 010_1111_1111 |
| 18 | 010010 | 100_1111_1110 | 50 | 110010 | 010_1111_1110 |
| 19 | 010011 | 100_0111_1111 | 51 | 110011 | 010_0111_1111 |
| 20 | 010100 | 100_0111_1110 | 52 | 110100 | 010_0111_1110 |
| 21 | 010101 | 100_0011_1111 | 53 | 110101 | 010_0011_1111 |
| 22 | 010110 | 100_0011_1110 | 54 | 110110 | 010_0011_1110 |
| 23 | 010111 | 100_0001_1111 | 55 | 110111 | 010_0001_1111 |
| 24 | 011000 | 100_0001_1110 | 56 | 111000 | 010_0001_1110 |
| 25 | 011001 | 100_0000_1111 | 57 | 111001 | 010_0000_1111 |
| 26 | 011010 | 100_0000_1110 | 58 | 111010 | 010_0000_1110 |
| 27 | 011011 | 100_0000_0111 | 59 | 111011 | 010_0000_0111 |
| 28 | 011100 | 100_0000_0110 | 60 | 111100 | 010_0000_0110 |
| 29 | 011101 | 100_0000_0011 | 61 | 111101 | 010_0000_0011 |
| 30 | 011110 | 100_0000_0010 | 62 | 111110 | 010_0000_0010 |
| 31 | 011111 | 100_0000_0001 | 63 | 111111 | 010_0000_0001 |

CDR CONTROL CIRCUIT, CDR CIRCUIT, AND CDR CONTROL METHOD

CROSS-REFERENCE TO RELATED APPLICATION

This application is based upon and claims the benefit of priority of the prior Japanese Patent Application No. 2015-129087, filed on Jun. 26, 2015, the entire contents of which are incorporated herein by reference.

FIELD

The present invention relates to a CDR control circuit, a CDR circuit, and a CDR control method.

BACKGROUND

In high-speed data transfer, the clock data recovery (CDR) technique to extract a clock from received data is known. In the CDR technique, a PLL generates multiphase clocks the phases of which are different by a predetermined angle from another (e.g., four-phase clocks the phases of which are different by 90° from another). A phase interpolator (PI) uniformly shifts the phase of a multiphase clock while keeping the phase difference in accordance with a PI code and generates a multiphase sampling clock for taking in data. A data latch circuit latches differential input data with a multiphase sampling clock. A de-serializer (DES) converts the data that is taken in with a multiphase sampling clock into parallel data and generates a plurality of data columns. A digital filter (DF) detects a phase shift of the multiphase sampling clock with respect to the differential input data from the plurality of data columns and changes the PI code so as to eliminate the phase shift. By repeating the feedback operation such as this, the difference between the phase of the differential input data and the phase of the multiphase sampling clock converges to zero. A state where the feedback operation is effective and the phase difference is close to zero is referred to as a locked state.

In the CDR circuit, in the case where the frequency of the differential input data differs from the frequency of the multiphase sampling clock by an infinitesimal amount, the phase difference changes resulting from the frequency difference, but the value of the PI code gradually changes to follow up this change, and therefore, the state where the phase difference is substantially zero is maintained.

In the CDR circuit, if the change in phase difference is gradual, the change is followed up as described above and the locked state is maintained, but if a rapid change in phase difference occurs, the state deviates from the locked state and there is a case where it is not possible to follow up the change. The rate of change that can be followed up is determined by the performance of the feedback system of the CDR circuit and can be adjusted by the gain of the digital filter, but if the rate of change that can be followed up is increased, the fluctuations in the locked state become large. In general, the jitter amount in data transfer is determined by the specifications of the data transfer system to which the CDR circuit is applied, and therefore, the gain of the digital filter is set in accordance therewith.

However, there is a case where a large jitter (time interval error (TIE)) exceeding a prescribed value occurs temporarily due to fluctuations in power source or noise. At this time, the CDR circuit operates so as to follow up the large fluctuations in the TIE, but the state deviates from the locked state and a synchronization error occurs because it is not possible to follow up the fluctuations. The CDR circuit repeats the feedback operation after that, but it is not possible to follow up the movement of the TIE, and therefore, a synchronization error occurs frequently, and even after the TIE fades away, the time until the locked state is resumed is lengthened. Because of this, also after the TIE fades away, the synchronization error remains for a while.

The large TIE such as described above frequently occurs at the time of start of reception or transmission, at the time of switching of transfer directions, etc., and therefore, the large TIE frequently occurs at the synchronization pattern portion at the top of a packet. In this case, the locked state of the CDR circuit deviates and it takes time to resume the locked state, and therefore, there occurs a situation in which the locked state is not resumed before the data portion arrives.

RELATED DOCUMENTS

[Patent Document 1] Japanese Laid Open Patent Publication No. 2014-171238
[Patent Document 2] Japanese Laid Open Patent Publication No. 2010-206735
[Patent Document 3] Japanese Laid Open Patent Publication No. 2012-205204

SUMMARY

According to a first aspect of embodiments, a CDR control circuit detects a phase shift of input data that is taken in with a phase-adjusted clock, and generates phase control data that controls the phase of the clock based on the detected phase shift, the CDR control circuit includes: a change detection circuit that detects an over-change in the phase shift; and a selection circuit that outputs the phase shift before the change, which is the phase shift before the time of detection of the over-change, as the phase shift for a predetermined period of time at the time of detection of the over-change, wherein during the predetermined period of time, the phase control data is generated based on the phase shift before change.

According to a second aspect of embodiments, a CDR circuit includes: a phase adjustment circuit that adjusts a phase of a multiphase reference clock to a phase corresponding to phase control data and generates a multiphase-adjusted clock; a latch circuit that takes in input data with a multiphase-adjusted clock; a de-serializer that converts a latched signal into parallel data; and a CDR control circuit that detects a phase shift from the parallel data and generates the phase control data based on the detected phase shift, wherein, the CDR control circuit includes: a change detection circuit that detects an over-change in the phase shift; and a selection circuit that outputs a phase shift before change, which is the phase shift before the time of detection of the over-change, as the phase shift during a predetermined period of time at the time of detection of the over-change, during the predetermined period of time, the phase control data being generated based on the phase shift before change.

According to a third aspect of embodiments, a CDR control method of detecting a phase shift of input data that is taken in with a phase-adjusted clock and generating phase control data that controls the phase of the clock based on the detected phase shift, the method includes: after an initial lock is completed, detecting the current phase shift; updating and holding a phase shift at a time a second time before the current time; calculating a difference between the phase shift at a time the first time before the current time and the current phase shift as an amount of change, and comparing the amount of change with a limit value of the phase shift per the first time; performing a CDR normal operation to generate the phase control data based on the current phase shift in a case where the amount of change does not exceed the limit value, suspending the CDR normal operation in a case where the amount of change exceeds the limit value, and generating the phase control data based on the phase shift at the time the second time before during a predetermined period of time; and resuming, after the predetermined period of time elapses, the CDR normal operation to generate the phase control data based on the current phase shift.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a diagram illustrating a table of output values corresponding to input values of a PDC function unit;

FIG. 8 is a diagram illustrating a conversion table with which the PI code encoder generates PI_CODE from preg;

DESCRIPTION OF EMBODIMENTS

Figure 1:
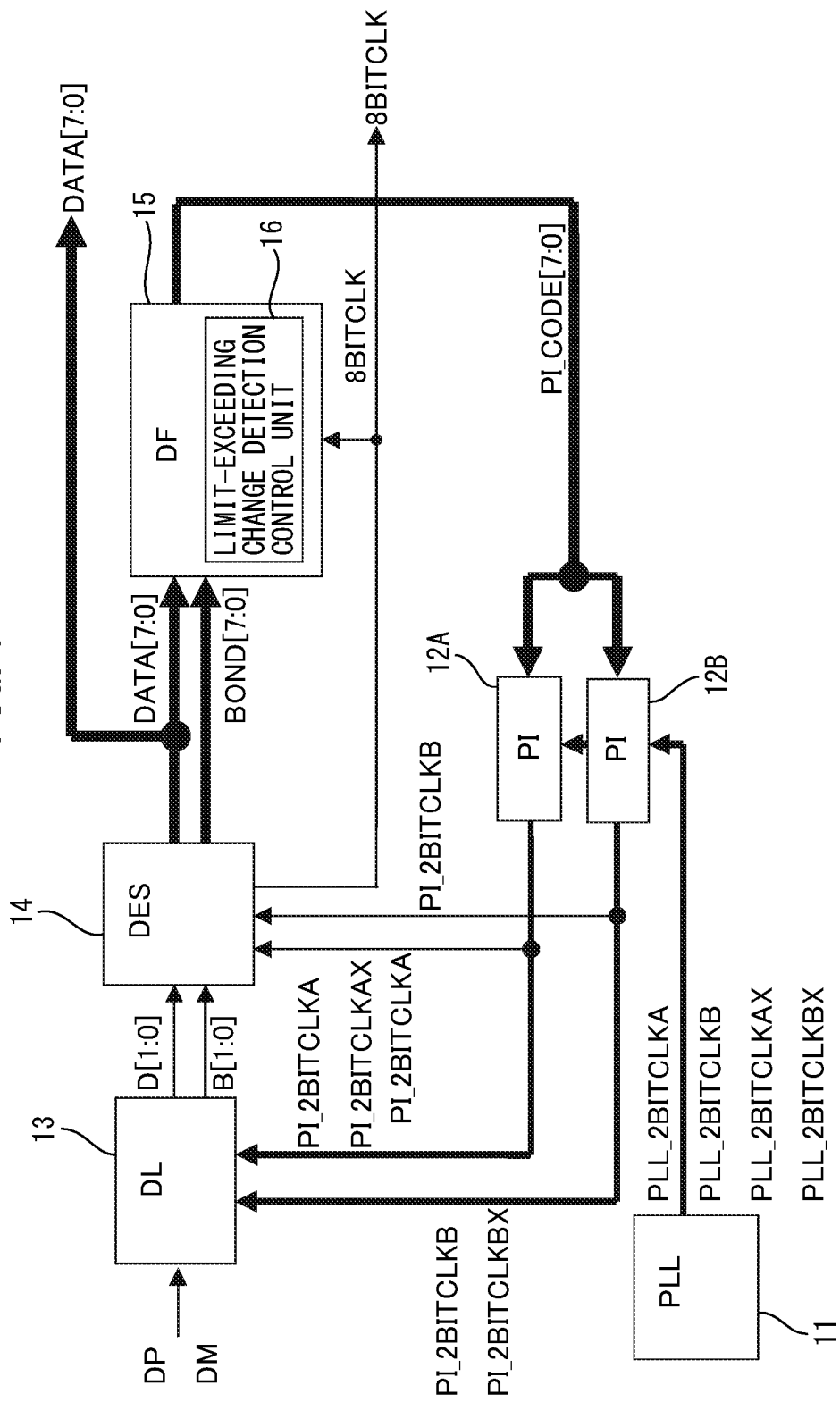
FIG. 1 is a diagram illustrating a configuration of a clock data recovery (CDR) circuit of an embodiment.

FIG. 1 is a diagram illustrating a configuration of a clock data recovery (CDR) circuit of an embodiment.

The CDR circuit of the embodiment has a PLL (Phase Locked Loop) circuit 11 and phase interpolators (PI) 12A and 12B. The CDR circuit further has a decision latch (DL) 13, a de-serializer (DES) 14, and a digital filter (DF) 15. The CDR circuit receives differential input data DP and DM. The CDR circuit of the embodiment differs from a general CDR circuit in that the DF 15 has a limit-exceeding change detection control unit 16 and the other portions are the same. First, the portions other than the limit-exceeding change detection control unit 16 are explained.

In the embodiment, it is assumed that the differential input data DP and DM is transferred at a double data rate in synchronization with a transfer clock. The PLL circuit 11 generates four-phase clocks PLL_2BITCLKA, PLL_2BITCLKB, PLL_2BITCLKAX, and PLL_2BITCLKBX that are approximate to the transfer clock of the input data DP and DM and the phases of which are different by 90° from another. Consequently, the frequency of the four-phase clocks is approximate to the frequency of the transfer clock generated on the transmission side, but they do not coincide with each other.

The PI 12A and the PI 12B combine the four-phase clocks based on PI code PI_CODE [7:0] that the DR 15 outputs and generate four-phase sampling clocks PI_2BITCLKA, PI_2BITCLKB, PI_2BITCLKAX, and PI_2BITCLKBX the phases of which have been uniformly shifted with the phase difference 90° being kept.

The DL 13 has two latches that latch the input data DP with the two-phase clocks PI_2BITCLKA and PI_2BITCLKAX and output data D [1:0], and two latches that latch the input data DM with the two-phase clocks PI_2BITCLKB and PI_2BITCLKBX and output boundary B [1:0:].

The DES 14 converts the 2-bit data D [1:0] and the 2-bit boundary B [1:0] into 8-bit data DATA [7:0] and 8-bit boundary BOND [7:0], respectively. The data DATA [7:0] is output as the received data DATA [7:0].

The DF 15 detects a phase shift with respect to the multiphase clock of the input data DP and DM from the data DATA [7:0] and the boundary BOND [7:0] and changes the PI code PI_CODE [7:0] so as to eliminate the phase shift.

The PLL circuit 11 is widely known, and therefore, explanation thereof is omitted. Further, the DL 13 is a latch circuit, and therefore, explanation thereof is omitted.

Figure 2:
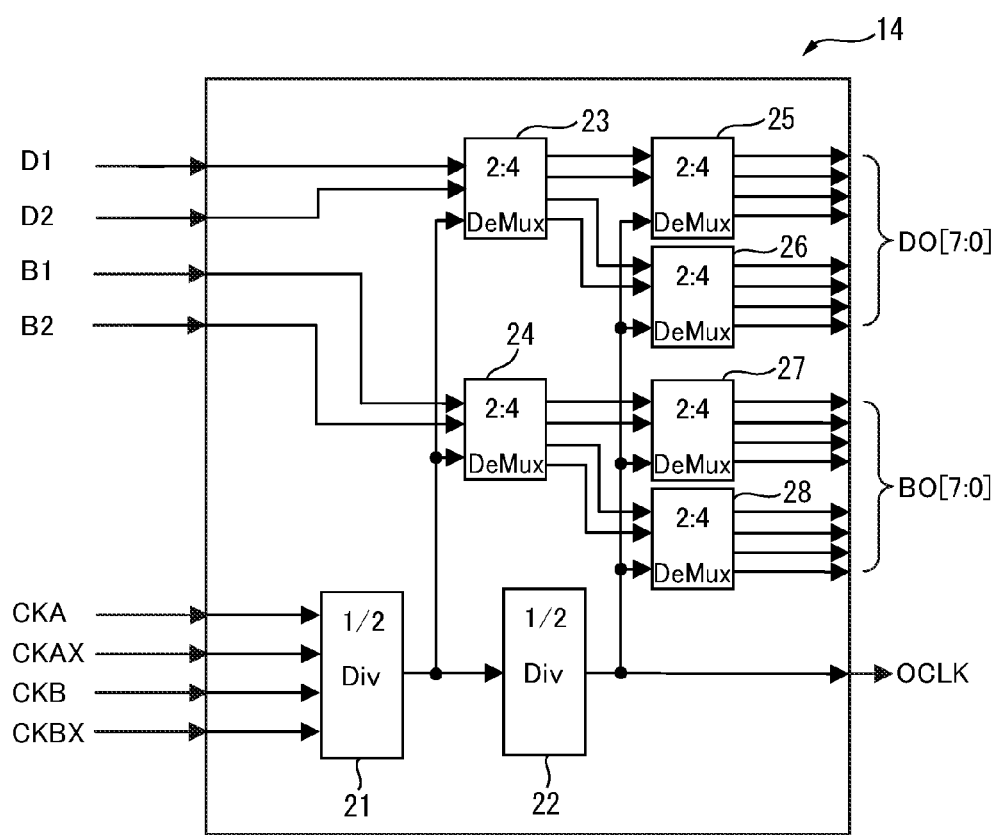
FIG. 2 is a diagram illustrating a circuit configuration of a de-serializer (DES)

FIG. 2 is a diagram illustrating a circuit configuration of the DES 14.

The DES 14 receives the four-phase sampling clocks PI_2BITCLKA, PI_2BITCLKB, PI_2BITCLKAX, and PI_2BITCLKBX that are output from the PI 12A and the PI 12B and the data D [1:0] and the boundary B [1:0] that are output from the DL 13. Here, PI_2BITCLKA, PI_2BITCLKB, PI_2BITCLKAX, and PI_2BITCLKBX are denoted as CLKA, CLKB, CLKAX, and CLKBX, and D [1:0] and B [1:0] are denoted as D1, D2, B1, and B2.

The DES 14 has two ½ divider circuits 21 and 22 and six 2:4 demultiplexers (2:4 DeMux) 23 to 28.

The ½-divider circuit 21 divides the four-phase clock by 2 and the ½-divider circuit 22 further divides by 2 the four-phase clock having been divided by 2. The ½-divider 22 outputs, for example, a clock generated by dividing the CLKA by 4 as OCLK. The OCLK is supplied to the DF 15 and is made use of as a base clock.

The 2:4 DeMux 23 converts the 2-bit D1 and D2 into 4-bit data in accordance with the CLKA and CLKAX having been divided by 2. The 2:4 DeMux 24 converts the 2-bit B1 and B2 into 4-bit data in accordance with the CLKB and CLKBX having been divided by 2. The 2:4 DeMux 25 to 28 divide the 2:4 DeMux 23 and the 2:4 DeMux 24 by 2 in accordance with the CLKA and CLKAX having been divided by 4 and output 8-bit data DO [7:0] and 8-bit boundary BO [7:0]. Here, it is assumed that when outputting parallel-converted DO [7:0] and B [7:0], the 2:4 DeMux 25 to 28 output them in synchronization with a clock generated by dividing the CLKA by 4, i.e., outputs them simultaneously.

Figure 3:
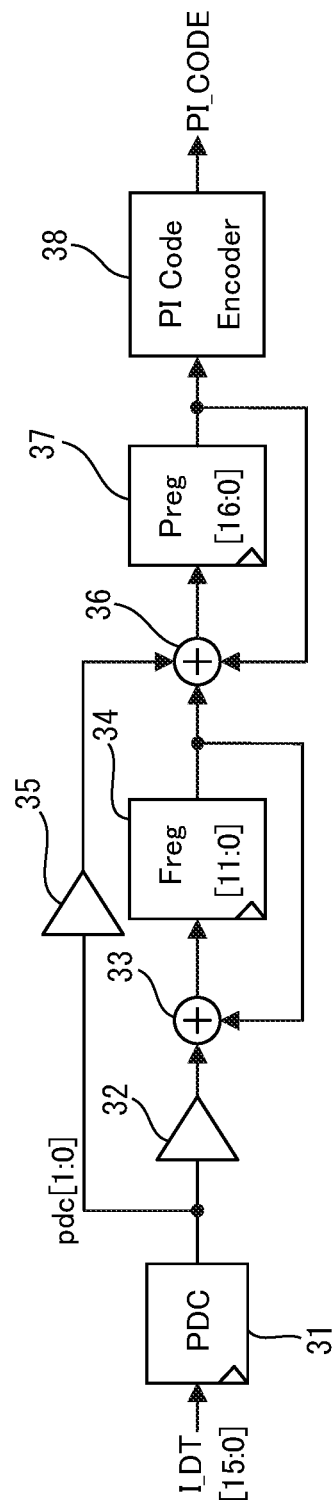
FIG. 3 is a diagram illustrating a configuration of a digital filter (DF)

FIG. 3 is a diagram illustrating a configuration of the DF 15.

The DF 15 has a phase detect comparator (PDC) 31, an amplifier 32, an adder 33, and a frequency register (Freg) 34. The DF 15 further has an amplifier 35, an adder 36, a phase register (Preg) 37, and a PI code encoder 38.

The DF 15 detects whether the phase of the four-phase sampling clock is advanced or delayed with respect to that of the input data DP and DM and outputs the parallel-converted data from the DES 14 and the boundary value as the PI_CODE after averaging them in the Preg 37. The PI_CODE is adjusted so that the change in the sampling clock (CKA, CKAX) occurs in the middle of the data. In this example, the DF 15 operates with the clock in the period corresponding to the four periods (4 UI) of the bit clock and that the phase is advanced, delayed, or neither advanced nor delayed that is detected by the PDC 31 is the average during the 4 UI. The Freg 34 detects the change in phase during the period of time longer than that of the Preg 37 as an integral element and adds the detection results to the Preg 37. The gains of the amplifiers 35 and 32 are GAINP and GAINF, respectively, and are constants that are set by a CPU, not illustrated. The Preg 37 generates a binary code that is represented by a complement of 2 and converts the binary code into the PI_CODE, which is a thermometer code, in order to eliminate a glitch at the time of change. As the numerical value representing a phase shift, the Preg value represents a phase shift more directly than the PI_CODE.

Figure 4:
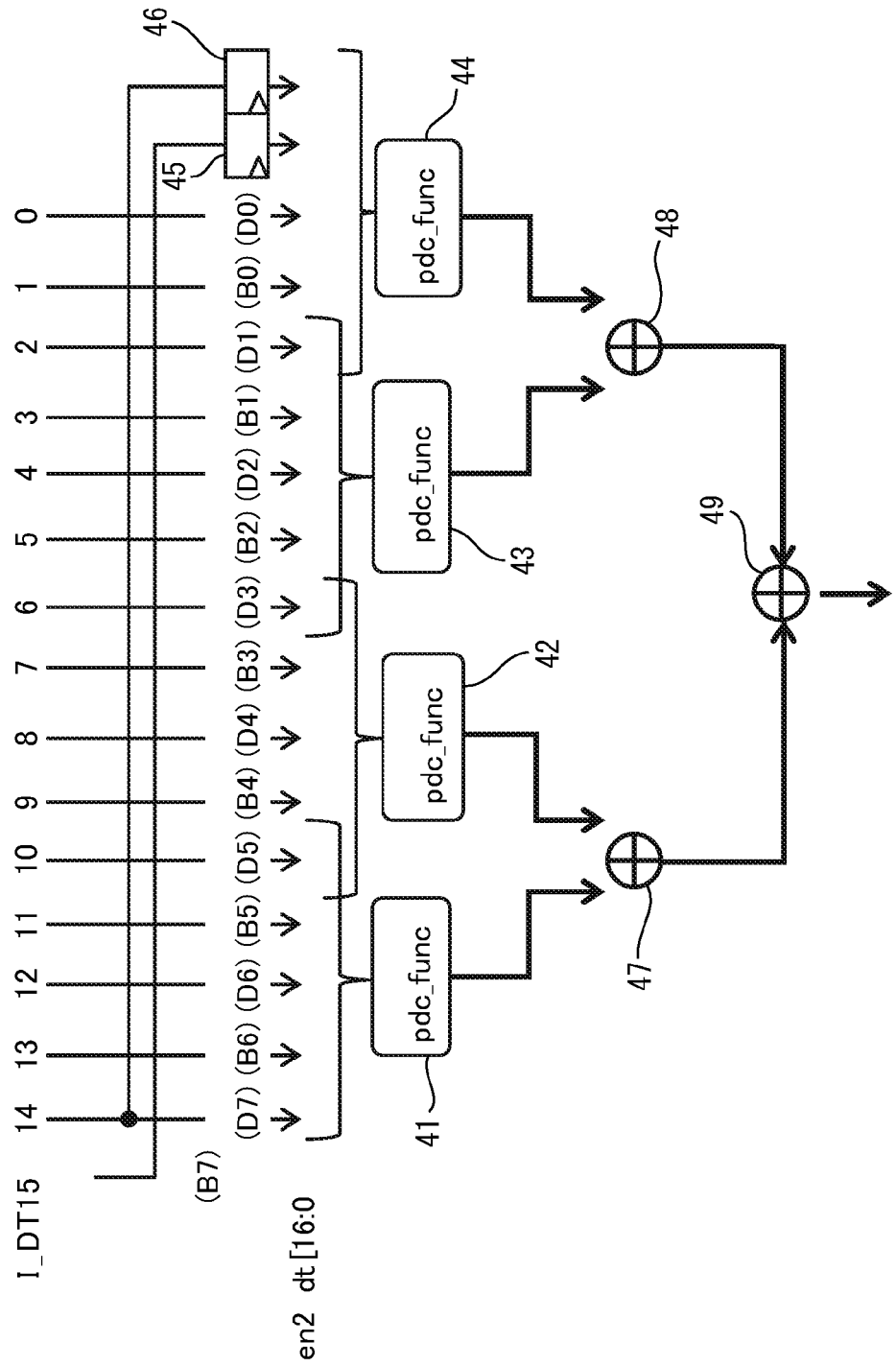
FIG. 4 is a diagram illustrating a configuration of a phase detect comparator (PDC)

FIG. 4 is a diagram illustrating a configuration of the PDC 31.

The PDC 31 has four PDC function units (pdc_func) 41 to 44 and three adders 47 to 49.

FIG. 5 is a diagram illustrating a table of output values corresponding to input values of the PDC function unit. The data other than the data described in the table in FIG. 5 is processed as a glitch even though not described in the table because data (Data)—boundary (Boundary)—data (Data) include "010" or "101".

The PDC function units 41 to 44 receive DATA [7:0] and BOND [7:0] by five bits at a time as illustrated in FIG. 4. The neighboring PDC function units receive the same one bit that belongs to both the PDC function units. The PDC function unit 44 receives D7 and B7 8 UI ahead, which are held by latches 45 46, besides D1, B0, and D0.

Each of the PDC function units 41 to 44 calculates whether the sampling clock hits the data in the middle phase by comparing the data value D with the boundary data B, which is the value latched at the position a phase of 90° advanced or delayed with respect to the data value D. In order to simultaneously compare a 2-bit change, the case where the phase is advanced is represented by −1, the case where the phase is delayed by 1, and in the case where the phase is in the middle or where there is no change by 0, and each case is output by a 3-bit complement of 2 because there are five kinds of results, i.e., −2, −1, 0, 1, and 2.

The output values of the four PDC function units 41 to 44 are added by the adders 47 to 49 to calculate the sum and the phase shift data from −8 to 8 is output as a 5-bit complement of 2. Further, in the case where a glitch is detected during 8 UI, the results of the previous 8 UI are taken over and output.

Finally, the PDC 31 outputs 2-bit data pdc [1:0] indicating the situation of the phase for each 8 UI, which is the unit of processing of the DF 15, i.e., 2-bit data "11" indicating that the phase is advanced, data "01" indicating that the phase is delayed, and data "00" indicating that the phase is in the middle.

Figure 6:
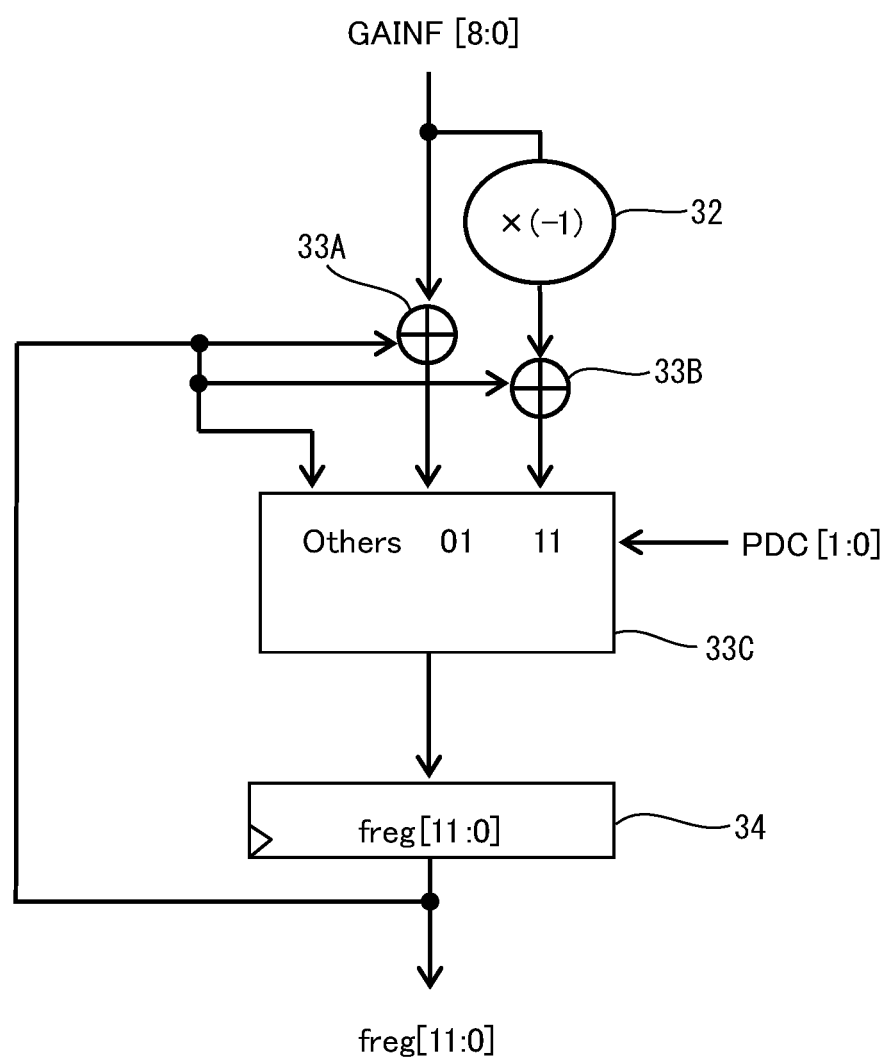
FIG. 6 is a diagram illustrating a configuration of the portion of an amplifier, an adder, and a frequency register (Freg)

FIG. 6 is a diagram illustrating a configuration of the portion of the amplifier 32, the adder 33, and the Freg 34.

The amplifier 32 is an amplifier that multiplies GAINF [8:0] by −1 and it can be said that an amplifier that multiplies GAINF [8:0] by +1 is substantially provided though not illustrated schematically. The adder 33 includes an adder 33A that adds GAINF [8:0] to the value of freg [11:0] and an adder 33B that adds −GAINF [8:0] to the value of freg [11:0]. The adder 33 further includes a selection circuit that sets one of the value of freg [11:0], the output of the adder 33A, and the output of the adder 33B to the Freg 34 in accordance with PDC [1:0]. The Freg 34 itself is one 12-bit register and holds freg [11:0].

By adding or subtracting the value of GAINF to or from the current value of freg [11:0] in accordance with the information about the advanced/delayed state (PDC) in the circuit illustrated in FIG. 6, an integrated value of the information about the advanced/delayed state is obtained. For example, in the case where the phase is advanced in PDC [1:0], this is reflected earlier in the Preg 37, and therefore, the PI 12A and 12B are moved in the direction in which the phase is delayed, but in the case of the Freg 34, GAIN is low, and therefore, the information about the advanced/delayed state is accumulated gradually. The Freg 34 is an element that positively delays the phase by adding the output value of the Freg 34 to the Preg 37 because it is known that the phase is changing in the direction in which the phase advances in the case where the information is accumulated in the direction in which the phase advances. The difference between the average value and the output value of Freg lies in that freg is the integrated value of the PDC output and it is possible to perform the frequency follow-up operation by adding this to preg.

Figure 7:
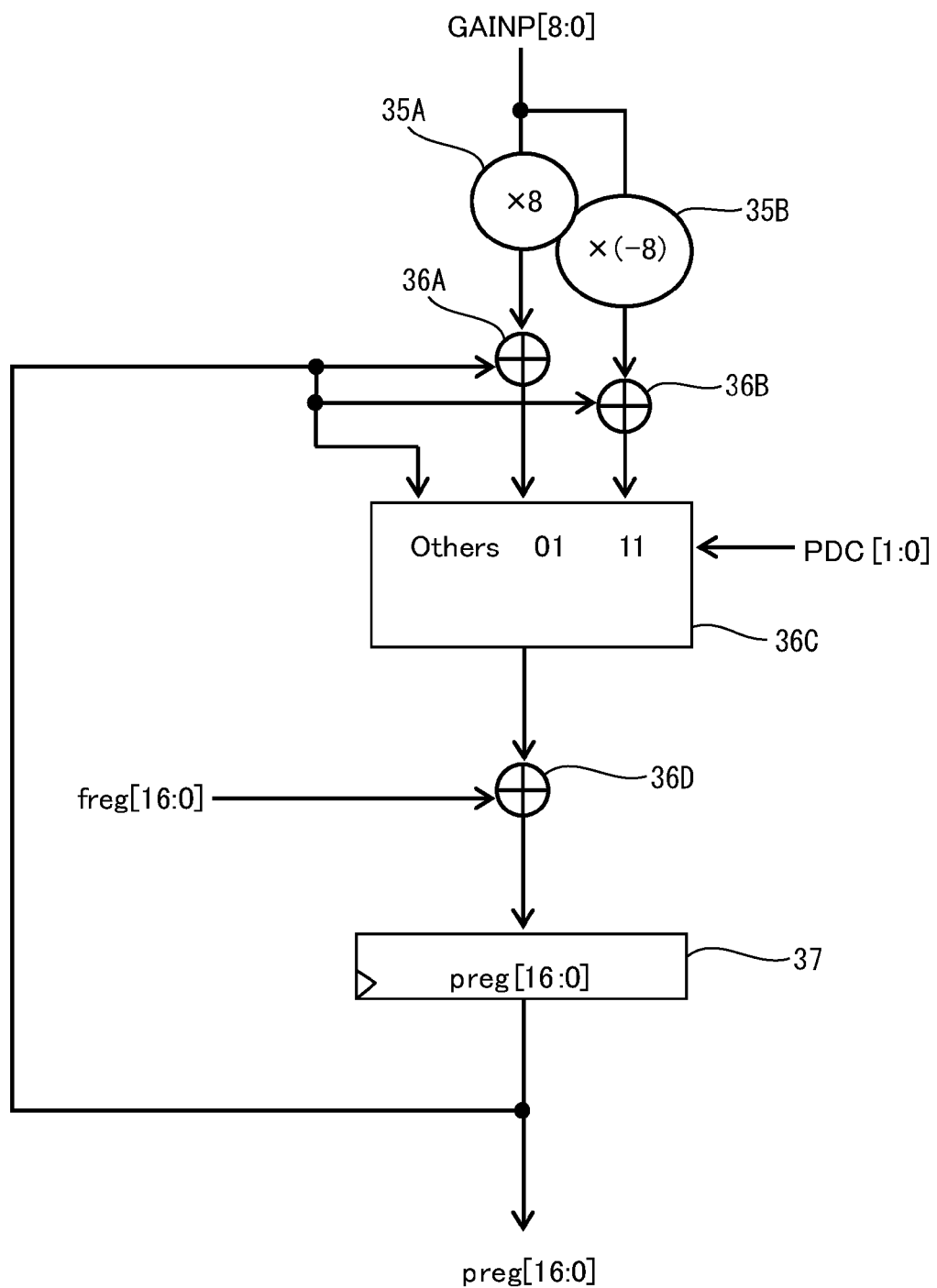
FIG. 7 is a diagram illustrating a configuration of the portion of an amplifier, an adder, and a phase register (Preg)

FIG. 7 is a diagram illustrating a configuration of the portion of the amplifier 35, the adder 36, and the Preg 37.

The amplifier 35 has an amplifier 35A that multiplies GAINP [8:0] by 8 and an amplifier 35B that multiplies GAINP [8:0] by −8. The adder 36 has adders 36A and 36B that add the outputs of the amplifiers 35A and 35B to the value of preg [16:0] and a selection circuit 36C that selects one of the value of preg [16:0] and the outputs of the adders 35A and 35B in accordance with PDC [1:0]. The adder 36 further has an addition circuit 36D that adds freg [16:0] to the output of the selection circuit 36C. The preg 37 itself is one 17-bit register and holds preg [16:0].

The portion of the Preg 37 in FIG. 7 is the same as the portion of the Freg 34 in FIG. 6 in that the value of GAINP is added to or subtracted from the current value of preg in accordance with the information about the advanced/delayed state (PDC). However, GAINP is set to a great value as compared to that of GAINF and as illustrated in FIG. 7 and GAINP is further multiplied by 8 internally, and therefore, the information about the advanced/delayed state is reflected in Preg earlier. Furthermore, Freg is also added, and therefore, it is possible to reflect fluctuations in the long-period phase.

FIG. 8 is a diagram illustrating a conversion table with which the PI code encoder 38 generates PI_CODE from preg. The PI code encoder 38 generates O_PICODED [10:0] from the highest six bits within preg [16:0]. In the case where preg is used as it is as the PI code at the time of phase adjustment, a glitch occurs on a clock because the number of bits that change is large, and therefore, the PI code encoder 38 converts preg into a code suitable to the PI code.

Figure 9:
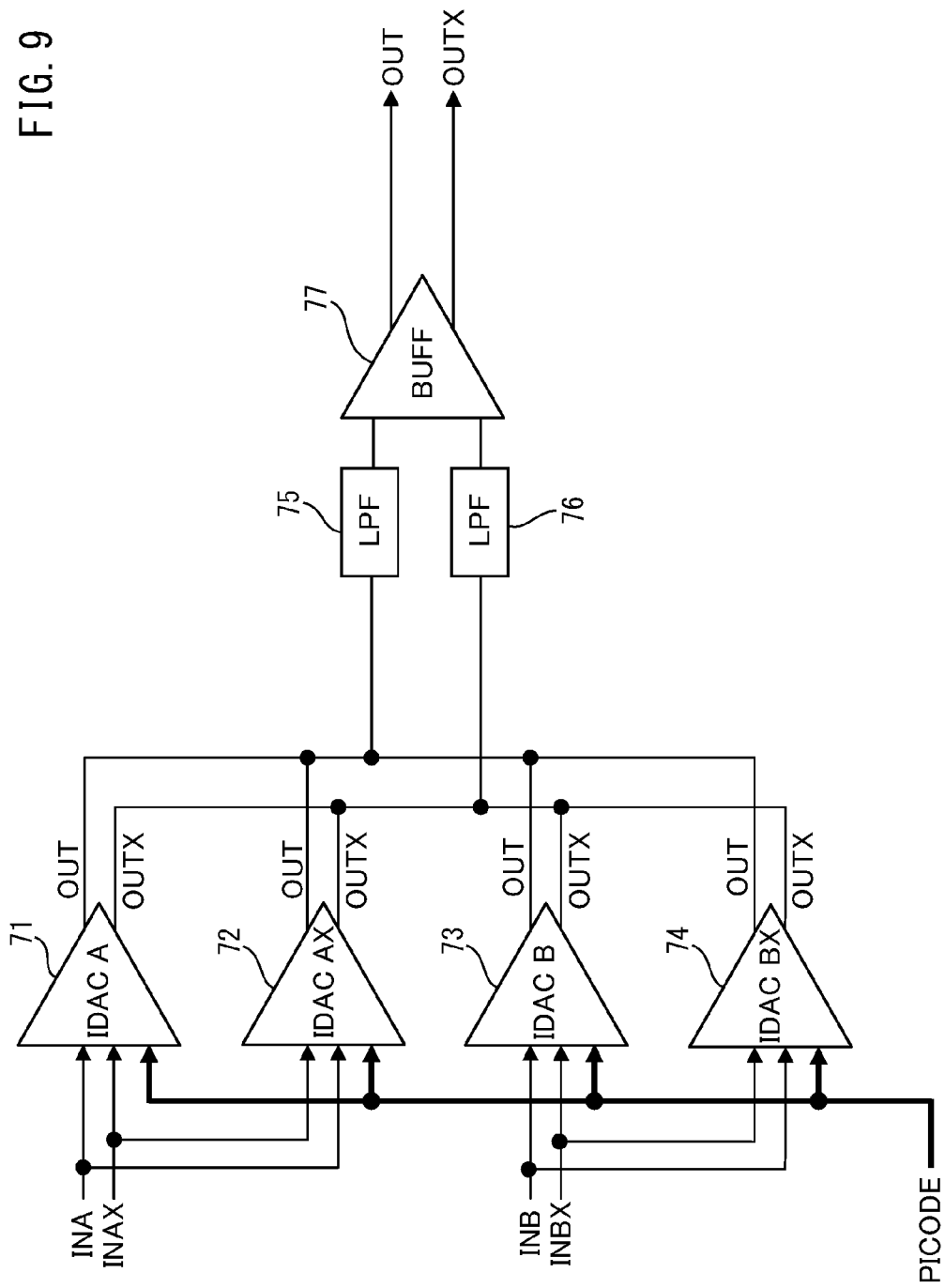
FIG. 9 is a diagram illustrating a circuit configuration of a phase interpolator (PI)

FIG. 9 is a diagram illustrating a circuit configuration of the PI 12A.

In FIG. 9, PLL_2BITCLKA is denoted as INA, PLL_2BITCLKAX as INAX, PLL_2BITCLKB as INB, PLL_2BITCLKBX as INBX, and PI_CODE [7:0] as PICODE.

The PI 12B also has the circuit configuration in FIG. 9, but the input positions of INA and INAX are exchanged and those of INB and INBX are exchanged.

The PI 12A has four current-type D/A converters (IDAC A), (IDAC AX), (IDAC B), and (IDAC BX) 71 to 74. Each IDAC intermingles complementary clocks (e.g., INA and INAX) in a mixture ratio indicated by PICODE. After the differential output currents of the four IDACs are added, the high-frequency component is removed by low-pass filters 75 and 76, and further, the change in signal is made steep by a butter (BUFF) 77. Due to this, the sampling clocks PI_2BITCLKA and PI_2BITCLKAX in which the phase corresponding to PICODE is shifted are generated.

Figure 10:
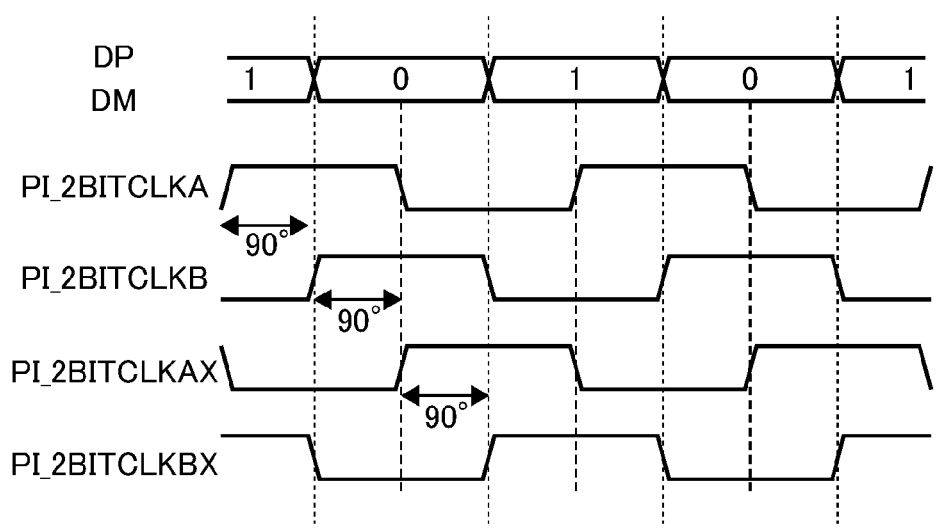
FIG. 10 is a time chart indicating the operation in the CDR circuit of the embodiment.

FIG. 10 is a time chart indicating the operation in the CDR circuit of the embodiment.

FIG. 10 illustrates a state where the phases of the differential input data DP and DM and the phases of the sampling clocks PI_2BITCLKA, PI_2BITCLKB, PI_2BITCLKAX, and PI_2BITCLKBX coincide with each other.

In the state in FIG. 10, the middle of the input data DP and DM is latched by the rising edges of the sampling clocks PI_2BITCLKA and PI_2BITCLKAX. At this time, the rising edges of PI_2BITCLKB and PI_2BITCLKBX coincide with the varying edges of the input data DP and DM. Because of this, for example, the value sampled with PI_2BITCLKB coincides with one of the values sampled with PI_2BITCLKA and PI_2BITCLKAX. In this state, the 2-bit output of the PDC 31 generally becomes "00", indicating the middle.

Figure 11A:
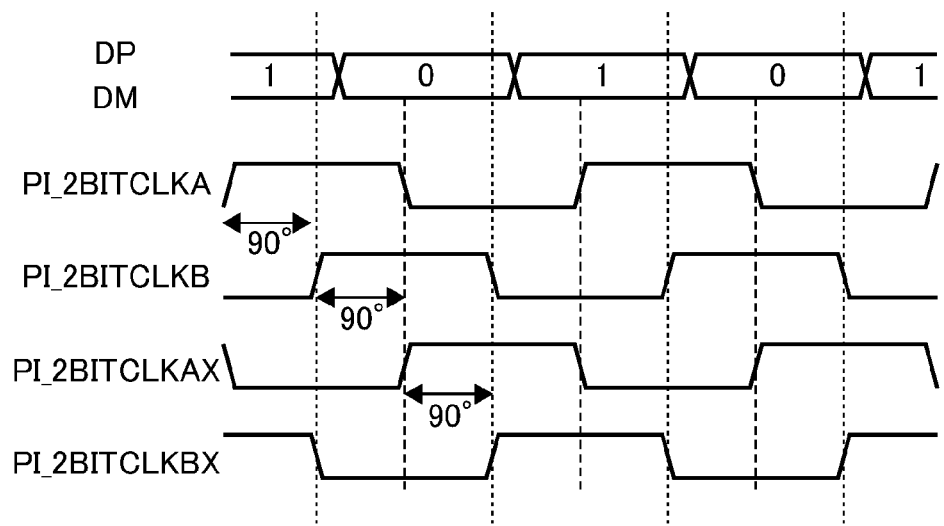
FIG. 11A is a time chart indicating the operation in the CDR circuit of the embodiment in a state where a sampling clock is advanced with respect to the input data.
Figure 11B:
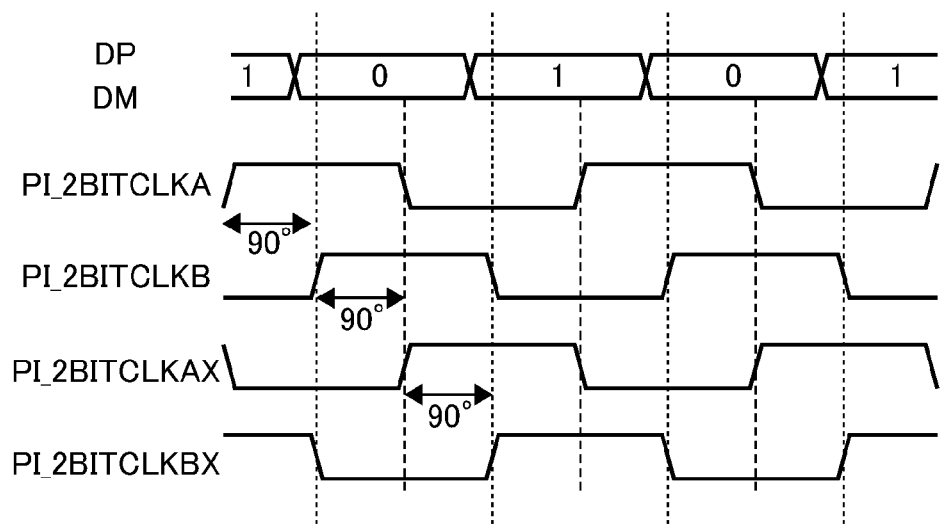
FIG. 11B is a time chart indicating the operation in the CDR circuit of the embodiment in a state where the sampling clock is delayed.

FIG. 11A and FIG. 11B are each a time chart indicating the operation in the CDR circuit of the embodiment and FIG. 11A illustrates the state where the sampling clock is advanced with respect to the input data DP and DM and FIG. 11B illustrates the state where the sampling clock is delayed.

As illustrated in FIG. 11A, in the state where the sampling clock is advanced, PI_2BITCLKA and PI_2BITCLKB or PI_2BITCLKAX and PI_2BITCLKBX latch the same data, and therefore, the 2-bit output of the PDC 31 becomes "11", and all of the sampling clocks are controlled so as to be delayed.

As illustrated in FIG. 11B, in the state where the sampling clock is delayed, PI_2BITCLKA and PI_2BITCLKBX or PI_2BITCLKAX and PI_2BITCLKB latch the same data, and therefore, the 2-bit output of the PDC 31 becomes "01", and all of the sampling clocks are controlled so as to be advanced.

The configuration and operation of the CDR circuit described above are widely known, and therefore, more explanation thereof is omitted. The embodiment to be explained below is not limited to the configuration and operation of the CDR circuit explained above and it is possible to apply the embodiment to a configuration capable of realizing the same functions.

The CDR circuit follows up the change as described above in the case where the change in phase difference is gradual and the locked state is maintained. The amount of data jitter (fluctuations in phase of input data) is determined by the specifications and it is possible to follow up the change in the case where the jitter falls within the range.

However, if a rapid change in phase difference occurs, the state deviates from the locked state and there is a case where it is not possible to follow up the change. For example, there is a case where a large jitter (Time Interval Error: TIE) exceeding a prescribed value occurs temporarily due to fluctuations in power source or noise. At this time, the CDR circuit operates so as to follow up the large fluctuations in the TIE, but in the case where it is not possible to follow up, the state deviates from the locked state and a synchronization error occurs.

The CDR circuit repeats the feedback operation also after the state deviates from the locked state because of the control characteristics thereof, but in the case where it is not possible to follow up the movement of the TIE even by the feedback operation, the synchronization error occurs frequently, and the time taken for the locked state to resume after the TIE fades away becomes long. Because of this, the synchronization error remains for a while also after the TIE fades away.

The large TIE such as described above frequently occurs at the time of start of reception or transmission, at the time of switching of transfer directions, etc., and therefore, the large TIE frequently occurs at the synchronization pattern portion at the top of a packet. For example, the communication path between a PC (Personal Computer) and a memory card or between a mobile terminal and a memory card has a plurality of channels and the ratio between the paths in the communication direction is changed at any time in accordance with circumstances. For example, the memory card has a plurality of channels and changes the ratio between the reception path from the communication partner and the transmission path to the communication partner. Accompanying the change from the reception path to the transmission path such as this, or the change vice versa, the memory card switches the input/output path for reception or transmission. For example, in the case where a certain path functions as the reception path or the transmission path, if the other path is changed from the reception path to the transmission path, or vice versa, comparatively large noise occurs accompanying the switching. This noise also affects the reception circuit or the transmission circuit operating at that point in time, and therefore, a large jitter occurs temporarily. This is also true with a PC or a mobile terminal that communicates with a memory card.

If a large jitter such as described above occurs, the locked state of the CDR circuit deviates, though temporarily, and it takes time to resume the locked state, and therefore, there occurs a situation where the state where communication can be performed is not returned before the data portion arrives.

In the embodiment explained below, a CDR circuit capable of returning quickly to the locked state after the TIE fades away even if a large jitter (TIE) occurs and the locked state deviates temporarily, a CDR control circuit, and a CDR control method are disclosed.

Figure 12:
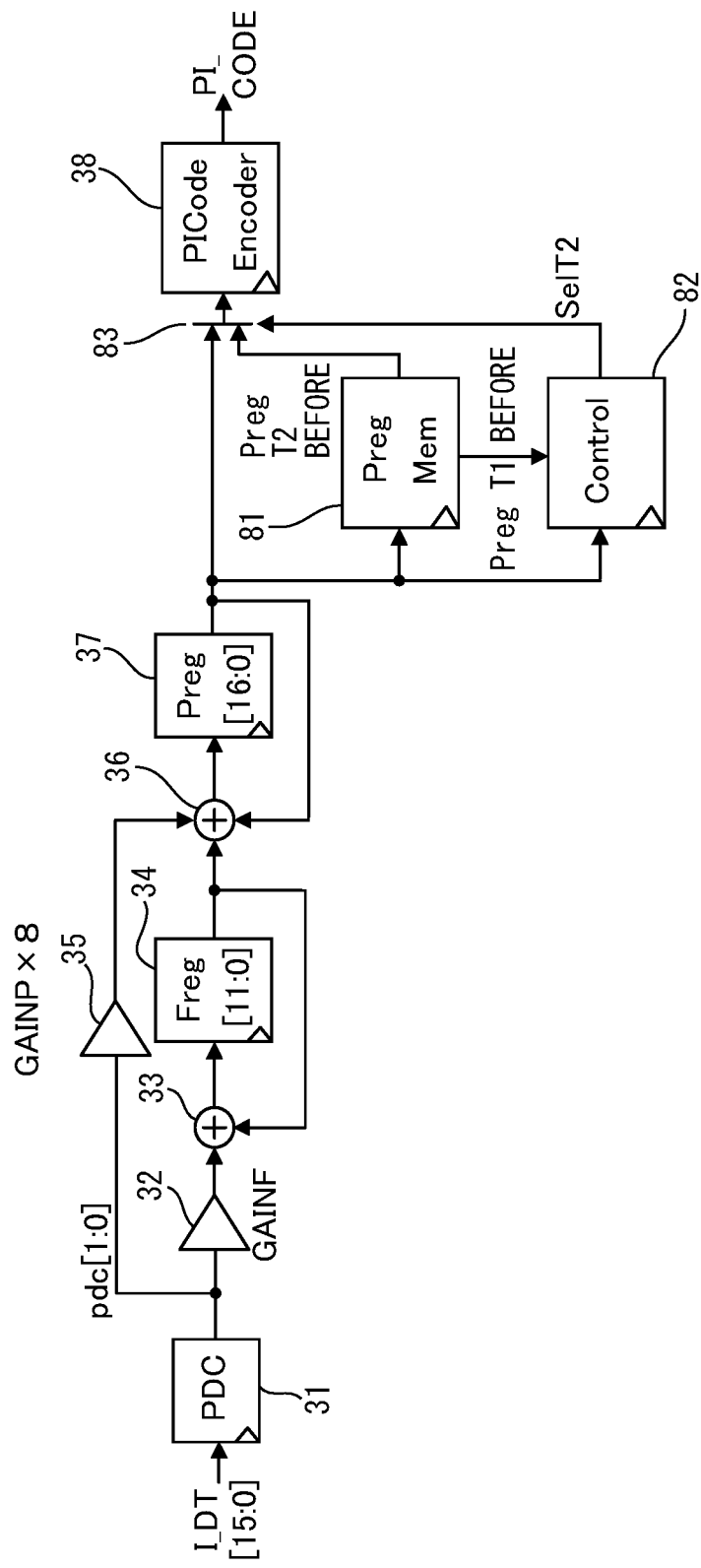
FIG. 12 is a block diagram illustrating a circuit configuration of a digital filter (DF) of a CDR circuit of a first embodiment.

FIG. 12 is a block diagram illustrating a circuit configuration of a digital filter (DF) of a CDR circuit of a first embodiment.

As illustrated in FIG. 1, the CDR circuit of the first embodiment differs from a common CDR circuit in that the DF 15 has the limit-exceeding change detection control unit 16 and the other portions are the same as those of the common CDR circuit. Further, the DF 15 of the first embodiment has a storage circuit (memory) (Preg Mem) 81 that stores Preg [16:0], a control circuit (Control) 82, and a selection circuit 83 in the configuration of the common DF in FIG. 3. In other words, the limit-exceeding change detection control unit 16 has the memory 81, the control circuit 82, and the selection circuit 83.

The memory 81 stores Preg [16:0] that the Preg 37 outputs in a predetermined number and sequentially updates the stored contents. Consequently, the memory 81 stores Preg [16:0] from that at the current point in time back to that the predetermined number ahead.

The selection circuit 83 selects one of Preg [16:0] that the Preg 37 outputs and Preg [16:0] time T2 before, which the memory 81 outputs, and outputs Preg [16:0] to the PI code encoder 38.

The control circuit 82 calculates a difference between Preg [16:0] that is output newly from the Preg 37 and Preg [16:0] time T1 before, which is stored in the memory 81, as an amount of change and determines whether the amount of change is larger than a limit value that is set. Then, the control circuit 82 outputs a selection signal SelT2 that controls the selection circuit 83 in accordance with the determination results. Specifically, the control circuit 82 performs control so that the selection circuit 83 selects Preg [16:0] that is output newly from the Preg 37 when the amount of change is smaller than the set limit value. The control circuit 82 performs control so that the selection circuit 83 selects Preg [16:0] T2 before, which the memory 81 outputs, as well as performing control so that the memory 81 outputs Preg [16:0] the time T2 before.

Due to this, when the amount of change in phase shift is larger than the limit value that is set in advance, it is determined that the TIE that cannot be followed up has occurred and the value is fixed to that of Preg in the past before the large TIE occurs so that the change is not followed up and the state stands by until the TIE fades away. Further, by reducing the time taken for the locked state to resume, the errors in data reception are reduced, and thereby, the abort or hangup due to the erroneous read of the control code is prevented.

Figure 13:
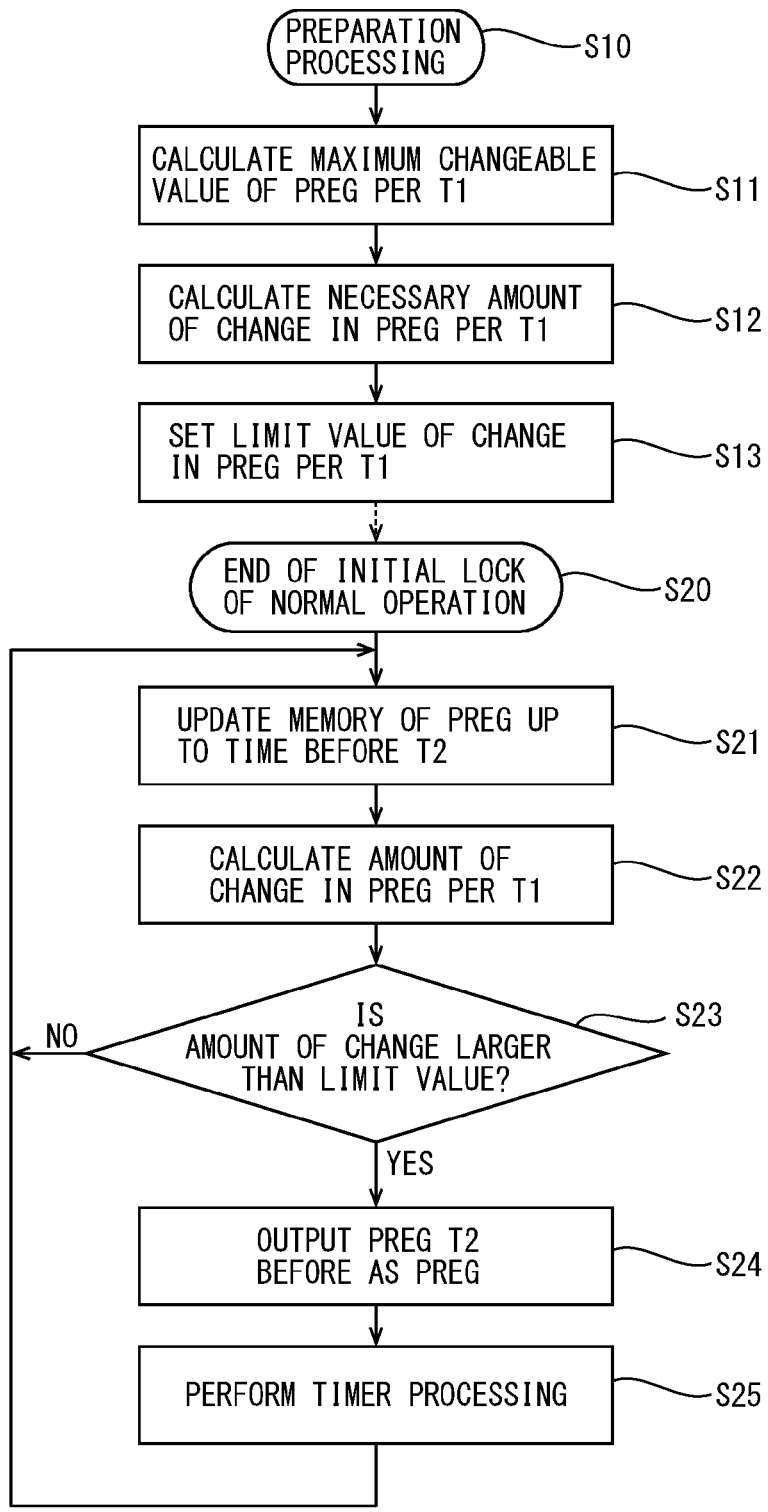
FIG. 13 is a flowchart indicating setting processing and operation processing of the limit-exceeding change detection control unit of the CDR circuit in the first embodiment.

FIG. 13 is a flowchart indicating setting processing and operation processing of the limit-exceeding change detection control unit 16 of the CDR circuit in the first embodiment.

At step S10, preparation (setting) processing is started. This processing is performed when a semiconductor device on which the CDR circuit is mounted is incorporated in equipment.

At step S11, from the gain setting of the DF 15, the maximum changeable value of Preg per operation clock time T1, which is a fixed amount, of the DF 15 is calculated. The period of the operation clock of the DF 15 corresponds to the cycle in which the DF 15 outputs a new Preg. For example, it is assumed that the maximum value of the amount of change in PI_CODE in the case where the state where the clock phase is advanced (or delayed) is being continuously detected by the PDC is set to $\Delta PI\_CODE/4\ UI = GAINP \times 8/1024 = 0.195$ [Code/4 UI], $\Delta PI\_CODE/100\ UI = 4.875$ [CODE/100 UI], on a condition that GAINP=25 and GAINF=0.

At step S12, from the jitter tolerance specifications, the amount of change in Preg that is necessary per time T1 is calculated. For example, in the case of the specifications 1.4 UI (234 kHz), if it is assumed that the resolution of PI is 32 Code per UI, 1.4 UI is 44.8 CODE. This corresponds to ¼ of a 234 kHz sinusoidal wave (=1/234 k/4=1.068 µs). If this is converted into the UI time, 1.068 µs/641 µs=1666.7 UI. Consequently, 44.8 Code per 1666.7 UI equals to 2.68 Code per 100 UI.

At step S13, between the maximum changeable value of Preg and the amount of change in Preg necessary per time T1, a limit value of change in Preg per time T1 is set. For example, 4 Code per 100 UI between 4.875 Code and 2.68 Code is taken to be a limit value.

The limit value determined at steps S11 to S13 is set to the control circuit 82. The time T1 is determined appropriately so that it is possible to determine a jitter in magnitude that suspends follow-up, and in the example described above, T1=100 UI. The time T2, to be described later, is a time before the time of detection of the occurrence of a large jitter, and is a time that can be regarded as a time during which the state was sufficiently stable, and of course, is a value greater than T1, and for example, T2 is set to a value between 200 and 600 UI. It is desirable that T1 and T2 can be set arbitrarily when incorporated in equipment and the control circuit 82 is caused to have a register for storing the set T1 and T2. The memory 81 is formed by, for example, an FIFO memory and it is necessary for the memory 81 to be capable of storing Preg corresponding to UI for T2, and if T2 increases, the capacity of the memory 81 increases accordingly. If it is made possible to set T2 arbitrarily, the memory 81 needs to have at least a capacity corresponding to the upper limit range that T2 can set.

Steps S20 to S25 indicate the processing while the CDR circuit is in operation.

At step S20, processing from the start of normal operation until the initial lock ends is performed. This processing is performed similarly to common processing.

At step S21, the memory 81 updates Preg [16:0] up to T2 before when new Preg [16:0] is output from the Preg 37. In the case where the memory 81 is an FIFO memory, the memory 81 overwrites the new Preg [16:0] in the address where the oldest Preg [16:0] is stored.

At step S22, the control circuit 82 reads Preg [16:0] T1 before from the memory 81 when Preg [16:0] is output newly from the Preg 37 and calculates a difference from the new Preg [16:0], i.e., the amount of change.

At step S23, the control circuit 82 determines whether the amount of change is larger than the limit value and in the case where the amount of change is smaller than the limit value, the processing returns to step S21 and in the case where the amount of change is larger than the limit value, the processing proceeds to step S24. Consequently, in the case where the amount of change is smaller than the limit value, the common CDR processing is continued. In the case where the amount of change is greater than the limit value, it is determined that the TIE has occurred and the follow-up operation of the CDR is suspended.

At step S24, the control circuit 82 performs control so that the memory 81 outputs Preg [16:0] T2 before and further performs control so that the selection circuit 83 selects Preg [16:0] T2 before, which the memory 81 outputs. Due to this, Preg [16:0] that is input to the PI code encoder 38 is fixed to Preg [16:0] T2 before.

At step S25, timer processing is started and time T3 that is set in advance is measured, and when T3 has elapsed, the processing returns to step S21 and the CDR operation to perform the common follow-up is resumed. It is desirable to set the time T3 in accordance with the time at which a large jitter occurs, but actually, it is not possible to predict the magnitude of a jitter that occurs, and therefore, the time T3 is set appropriately by taking into consideration the characteristics of equipment to be mounted. For example, T3 is set to T2.

Figure 14:
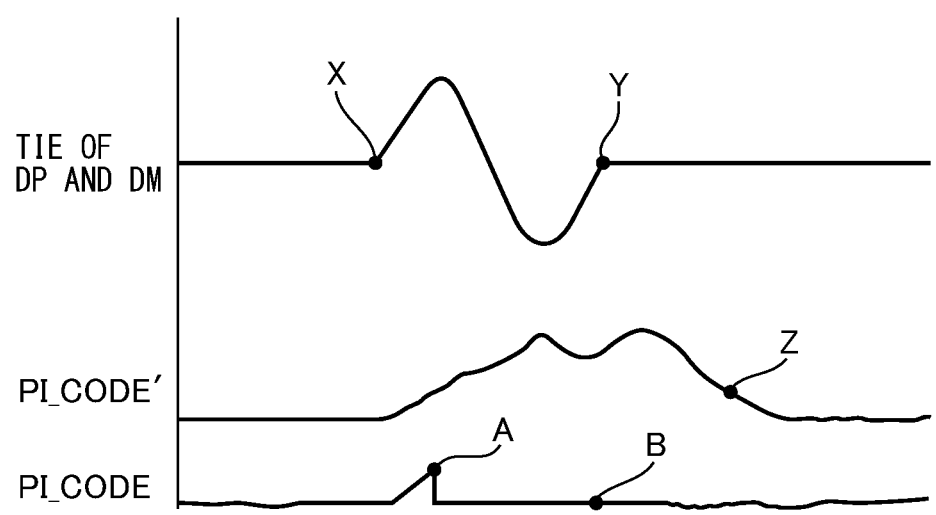
FIG. 14 is a diagram illustrating the change in the PI code in the case where a TIE has occurred in the input data in the CDR circuit of the first embodiment.

FIG. 14 is a diagram illustrating the change in the PI code in the case where the TIE has occurred in the input data DP and DM in the CDR circuit of the first embodiment and PI_CODE' indicates the PI code in the case of a common CDR circuit and PI_CODE indicates the PI code in the case of the first embodiment.

As illustrated in FIG. 14, in the case where a large TIE occurs in the input data DP and DM between a point in time indicated by X and a point in time indicated by Y, control to follow up the change is performed in a common CDR circuit. However, it is not possible to follow up the change and even after the point in time indicated by Y at which the jitter disappears, the unlocked state continues and the locked state resumes at a point in time indicated by Z. In contrast to this, in the first embodiment, it is determined to suspend follow-up at a point in time indicated by A and PI_CODE is fixed to the value T2 before. Then, immediately after resuming follow-up at a point in time indicated by B, the locked state is resumed. As described above, in the first embodiment, it does not take almost any time for the CDR resumes the locked state again after the TIE fades away and the bit errors of the read data are reduced, and therefore, symbol erroneous detection occurs less frequently.

In the first embodiment, the memory 81 has a capacity for storing Preg [16:0] up to the time T2, but there is such a problem that a large capacity is needed when T2 becomes as large as 600 UI. A CDR circuit of a second embodiment, to be explained below, is one in which the capacity of the memory 81 is reduced.

Figure 15:
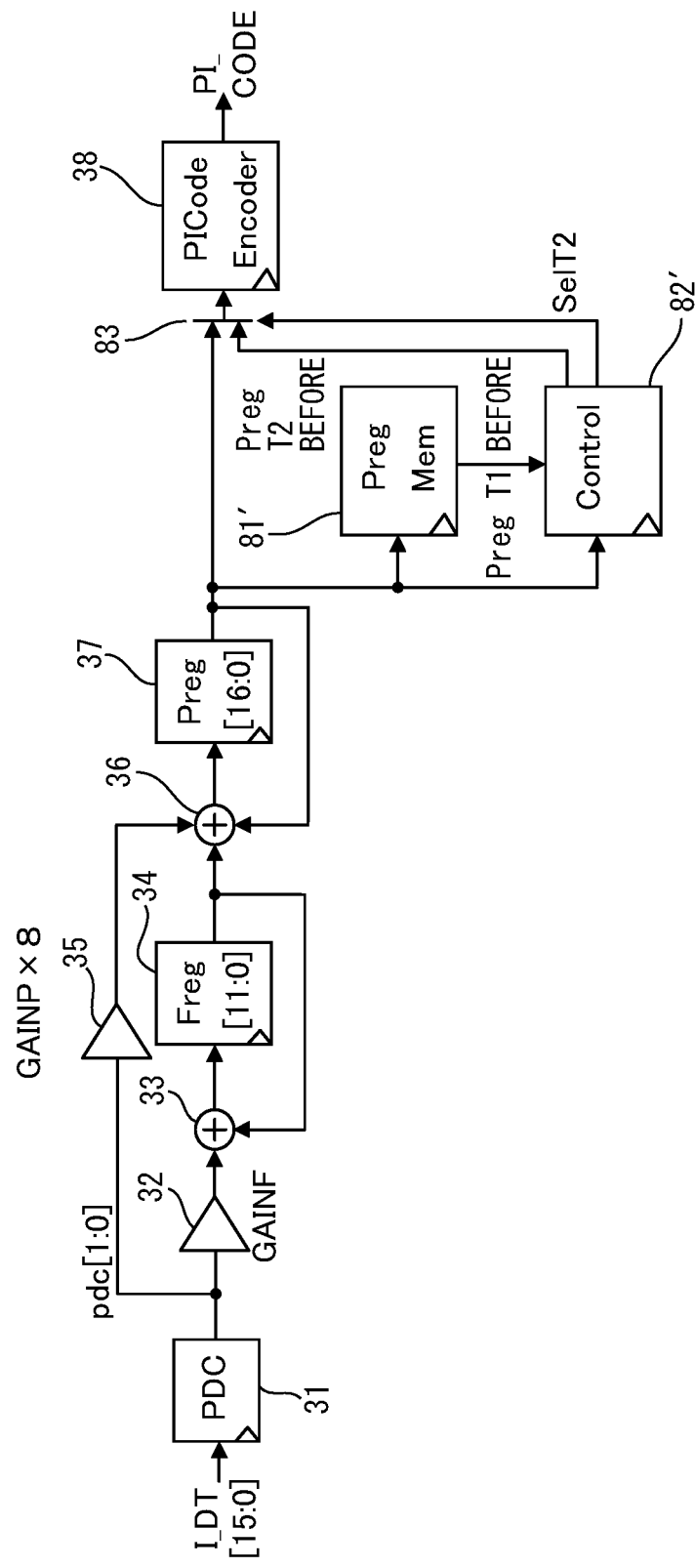
FIG. 15 is a block diagram illustrating a circuit configuration of a digital filter (DF) of a CDR circuit of a second embodiment.

FIG. 15 is a block diagram illustrating a circuit configuration of a digital filter (DF) of the CDR circuit of the second embodiment.

The CDR circuit of the second embodiment has a configuration similar to that of the first embodiment and the limit-exceeding change detection unit 16 of the DF 15 also has a similar configuration, but the CDR circuit of the second embodiment differs from that of the first embodiment in having a memory 81' having a small capacity in place of the memory 81 and a control circuit 82' the configuration of which is somewhat different.

In the second embodiment, the memory 81' has a capacity for storing Preg [16:0] up to the time T1. The control circuit 82' has a register (latch) for storing stable Preg [16:0] before change, which is the stable Preg [16:0] before the occurrence of a jitter, in addition to the configuration of the first embodiment. As in the first embodiment, the control circuit 82' calculates an amount of change, which is a difference between Preg [16:0] newly output and Preg [16:0] T1 before, and performs processing to determine whether the amount of change is smaller than a predetermined threshold value, and outputs the selection signal SelT2 that controls the selection circuit 83 based on the results of the determination. The control circuit 82' determines whether the calculated amount of change is smaller than the predetermined threshold value and writes Preg [16:0] T1 before in the register in the case where the amount of change is smaller than the predetermined threshold value. In the case where the amount of change is larger than the threshold value, nothing is written in the register, and therefore, the register holds the previous value. The predetermined threshold value is a sufficiently small value. If the CDR circuit is locked, the change in Preg [16:0] is small and stable, and therefore, the register stores Preg [16:0] in the locked state immediately before the detection of a jitter as Preg [16:0] before change. In the second embodiment, Preg [16:0] before change is used in place of Preg [16:0] T2 before in the first embodiment. Due to this, it is possible to reduce the memory capacity as compared with that in the first embodiment. The other portions are the same as those of the first embodiment, and therefore, explanation thereof is omitted.

Figure 16:
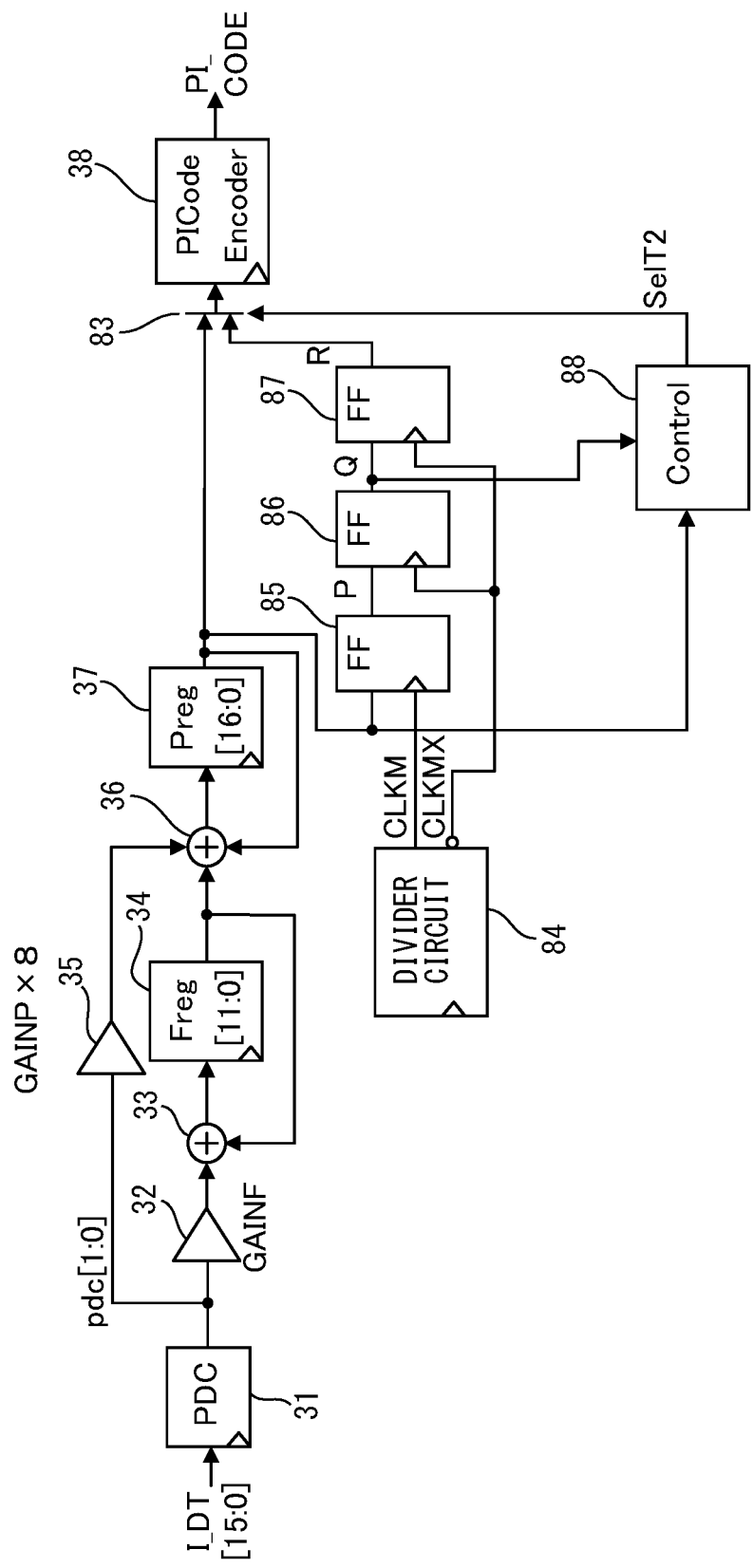
FIG. 16 is a block diagram illustrating a circuit configuration of a digital filter (DF) of a CDR circuit of a third embodiment.

FIG. 16 is a block diagram illustrating a circuit configuration of a digital filter (DF) of a CDR circuit of a third embodiment.

The CDR circuit of the third embodiment has a configuration similar to that of the first embodiment and the limit-exceeding change detection unit 16 also has a similar configuration, but the CDR circuit of the third embodiment differs from that of the first embodiment in having a divider circuit 84 and three latch circuits (FF) 85 to 87 and in not using the memory 81. Further, the limit-exceeding change detection unit 16 has a control circuit (Control) 88 the configuration of which is somewhat different in place of the control circuit 82.

The divider circuit 84 divides the clock CLK (OCLK) in the period corresponding to the cycle in which the Preg 37 outputs Preg [16:0] and outputs CLMK in the positive phase and CLKMX in the opposite phase. For example, if it is assumed that the one period of CLK is 1 UI, T1 of the first embodiment is 129 UI (T1=129 UI), and T2 is 395 UI (T2=395 UI), the divider circuit 84 divides CLK by 128. The FF 85 latches Preg [16:0] that the Preg 37 outputs at the rising edge of CLMK that the divider circuit 84 outputs and outputs P. The FF 86 latches P that the FF 85 outputs at the rising edge of CLKMX that the divider circuit 84 outputs and outputs Q. The FF 87 latches Q that the FF 86 outputs at the rising edge of CLKMX that the divider circuit 84 outputs and outputs R. The control circuit 88 calculates an amount of change from Preg [16:0] that the Preg 37 outputs and Q that the FF 86 outputs and outputs the selection signal SelT2 based on the results of the comparison between the amount of change and the limit value. The selection circuit 83 selects one of Preg [16:0] that the Preg 37 outputs and R that the FF 87 outputs in accordance with the selection signal SelT2.

Figure 17:
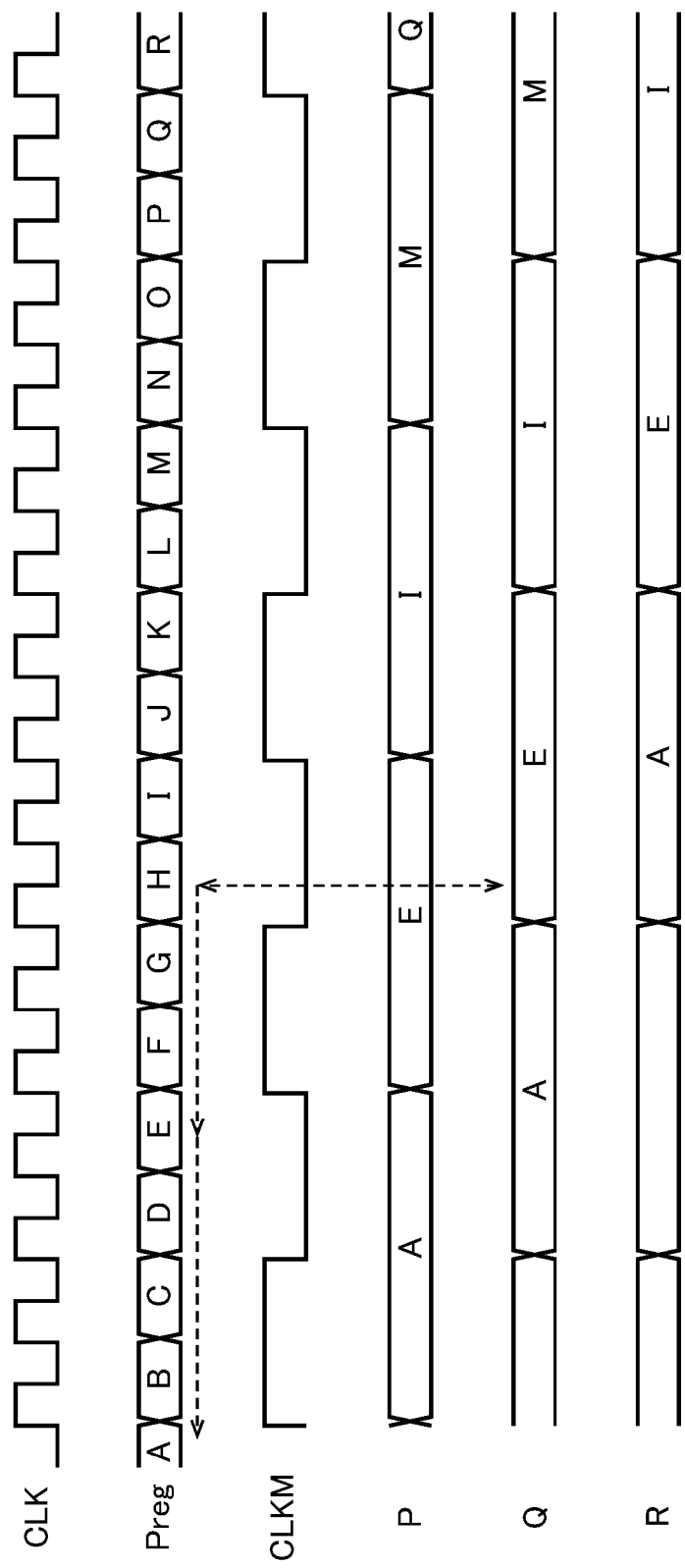
FIG. 17 is a time chart indicating the change in output of a divider circuit and the three FFs in the third embodiment.

FIG. 17 is a time chart indicating the change in output of the divider circuit and the three FFs in the third embodiment. Because of limitation to schematic representation, here, the case where the divider circuit divides a clock by 4 is illustrated as an example.

As illustrated in FIG. 17, the Preg 37 outputs Preg [16:0] in synchronization with the rising edge of CLK. CLKM is a signal generated by dividing CLK by 4 by the divider circuit 84 and CLKMX is a signal the phase of which is opposite to that of CLKM. The FF 85 latches Preg [16:0] in synchronization with the rising edge of CLKM and outputs P, and therefore, P changes in the four periods of CLK. The FF 86 latches P in synchronization with the rising edge of CLKMX and outputs Q, and therefore, Q is a signal obtained by delaying P by an amount corresponding to the two periods of CLK. Further, the FF 87 latches Q in synchronization with the rising edge of CLKMX and outputs R, and therefore, R is a signal obtained by delaying Q by an amount corresponding to the four periods of CLK, i.e., a signal obtained by delaying P by an amount corresponding to the six periods and obtained by delaying Preg [16:0] by an amount corresponding to the seven periods.

The control circuit 88 compares Preg [16:0] that the Preg 37 outputs with Q, i.e., Preg [16:0] three periods ahead. Q corresponds to Preg T1 before in the first embodiment. Further, in the case where a difference between Preg [16:0] that the Preg 37 outputs and Q is larger than a limit value, the selection circuit 83 outputs R, i.e., Preg [16:0] seven periods ahead as Preg [16:0] before change.

In the case where the divider circuit 84 divides a clock by 256, T1 corresponds to a time 129 periods ahead and T2 corresponds to a time 395 periods ahead. It is desirable that the divider circuit 84 divide by powers of two because of simplification of the circuit configuration and it is desirable that T1 and T2 be appropriately set in this range. The other portions of the third embodiment are the same as those of the first embodiment.

In the CDR circuit of the third embodiment, the limit-exceeding change detection control unit 16 only has the divider circuit and the three FFs in place of the memory, and therefore, it is possible to reduce the circuit scale.

In the first to third embodiments, whether a jitter that cannot be followed up has occurred is detected by detecting the amount of change in Preg [16:0] that the Preg 37 outputs, but it is possible to detect whether a large jitter has occurred from another signal, for example, pdc [1:0] that the PDC 31 outputs. In a fourth embodiment to be explained next, whether a large jitter has occurred is detected from pdc [1:0] that the PDC 31 outputs.

Figure 18:
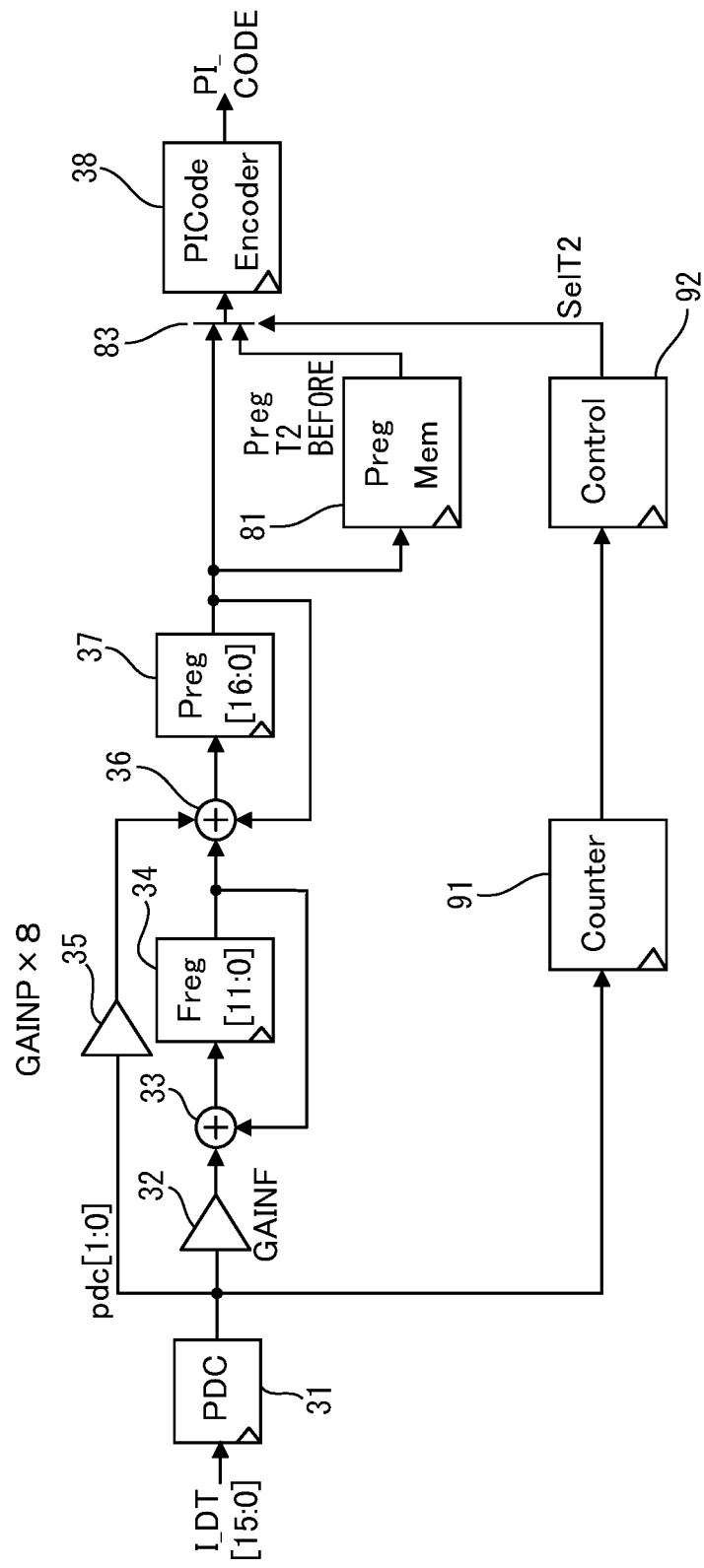
FIG. 18 is a block diagram illustrating a circuit configuration of a digital filter (DF) of a CDR circuit of a fourth embodiment.

FIG. 18 is a block diagram illustrating a circuit configuration of a digital filter (DF) of a CDR circuit of the fourth embodiment.

The CDR circuit of the fourth embodiment has a configuration similar to that of the first embodiment and the limit-exceeding change detection control unit 16 also has a similar configuration, but the CDR circuit of the fourth embodiment differs from that of the first embodiment in having a counter (Counter) 91 and a control circuit 92 in place of the control circuit 82.

The counter 91 is an up-down counter and calculates an accumulated value of pdc [1:0] that the PDC 31 outputs, and when a set lower limit or upper limit is reached, outputs a limit-reached signal to the control circuit (Control) 92. As described previously, pdc [1:0] outputs "11" in the case of an advanced (early) state, outputs "01" in the case of a delayed state, and output "00" in the case where the phase is in the middle. Consequently, in the locked state, it is unlikely that "11" or "01" is output successively, and therefore, the count value of the counter 91 is unlikely to reach the lower limit or the upper limit. In contrast to this, when a large jitter occurs, "11" or "01" is output successively for a long period of time, and therefore, the count value of the counter 91 reaches the lower limit or the upper limit. Because of this, upon receipt of a signal indicating that the count value has reached the lower limit or the upper limit from the counter 91, the control circuit 92 outputs the selection signal SelT2 so that Preg [16:0] T2 before, which is stored in the memory 81, is input to the PI code encoder for a predetermined period of time. Due to this, as in the first embodiment, the follow-up operation of the CDR is suspended for a predetermined period of time.

In the case where there is a small difference in frequency between the transfer clock and the clock that the PLL circuit outputs, the accumulated value of pdc [1:0], i.e., the count value of the counter 91 gradually decreases or increases, and therefore, there is a possibility that the lower limit or the upper limit will be reached. Because of this, the counter 91 is designed so as to be reset periodically.

It is also possible to apply the configuration of the fourth embodiment to the second and third embodiments.

In the first to fourth embodiments, follow-up is suspended after a large jitter is detected and the period of time during which Preg [16:0] before change is output is determined in advance. However, in the case where a jitter is larger and longer than supposed, the influence still remains when follow-up is resumed, and therefore, there is a case where it is not possible to perform follow-up. In this case, the follow-up is suspended again and Preg [16:0] before change is output for a predetermined period of time as a result, and therefore, there is such a problem that the time taken to return to the state where follow-up is performed again, i.e., the time taken to return to the locked state is significantly lengthened. On the contrary, in the case where the jitter is smaller and shorter than supposed, the locked state returns immediately at the point in time when follow-up is resumed, and therefore, it is possible to consider that follow-up could be resumed earlier. Because of this, if the length of the period of time during which follow-up is suspended is set to a fixed length regardless of the magnitude of a jitter, a wasteful time occurs before the locked state returns again. In a CDR circuit of a fifth embodiment that is explained next, the period of time during which follow-up is suspended is reduced by changing the period of time during which follow-up is suspended in accordance with the rate of change in jitter on the assumption that the more rapid the change, the larger a jitter is.

Figure 19:
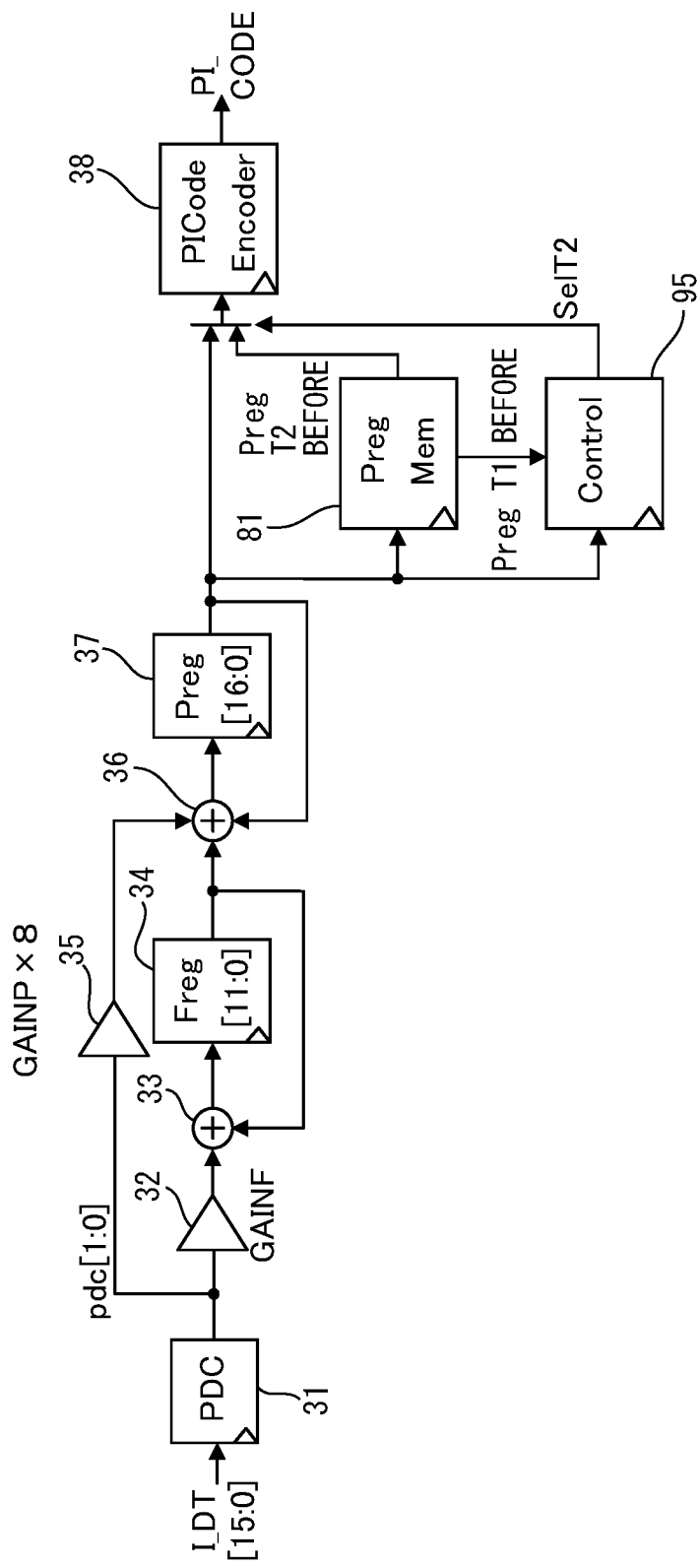
FIG. 19 is a block diagram illustrating a circuit configuration of a digital filter (DF) of a CDR circuit of a fifth embodiment.

FIG. 19 is a block diagram illustrating a circuit configuration of a digital filter (DF) of the CDR circuit of the fifth embodiment.

The CDR circuit of the fifth embodiment has a configuration similar to that of the first embodiment and the limit-exceeding change detection unit 16 of the DF 15 also has a similar configuration, but the CDR circuit of the fifth embodiment differs from that of the first embodiment in having a control circuit 95 that performs control somewhat different, in place of the control circuit 82.

As in the first embodiment, the control circuit 95 calculates a difference between Preg [16:0] that the Preg 37 outputs and Preg [16:0] T1 before as an amount of change and detects whether a large jitter that cannot be followed up has occurred by comparing the amount of change with the limit value. In addition to this, the control circuit 95 changes the period of time during which follow-up is suspended in accordance with the amount of change because the magnitude of the amount of change corresponds to the rate of change in jitter. For example, in the case where the amount of change is slightly larger than the limit value, a short period of time during which follow-up is suspended is set and in the case where the amount of change is significantly larger than the limit value, a long period of time during which follow-up is suspended is set. The control circuit 95 performs the same processing as that of the control circuit 82 of the first embodiment except for changing the period of time during which follow-up is suspended.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A clock data recovery control circuit that detects a phase shift of input data that is taken in with a phase-adjusted clock, and generates phase control data that controls a phase of the clock based on the detected phase shift, the clock data recovery control circuit comprising:
a change detection circuit that detects an over-change in the phase shift based on an amount of a change of the phase shift during a first period of time; and
a selection circuit that outputs the phase shift before change, which is the phase shift before the time of detection of the over-change, as the phase shift for the first period of time at the time of detection of the over-change, wherein
during the first period of time after the time of detection of the over-change, the phase control data is generated based on the phase shift before change.

2. The clock data recovery control circuit according to claim 1, further comprising a storage circuit that stores the phase shift, wherein
the change detection circuit:
calculates a difference between the phase shift at a time a first time before the time of detection of the over-change, the phase shift being stored in the storage circuit, and the current phase shift as the amount of change; and
compares a limit of the phase shift at the time the first time before, the limit being determined from a maximum amount of change that is followed up, and the calculated amount of change, and determines that the over-change has occurred when the amount of change exceeds the limit.

3. The clock data recovery control circuit according to claim 2, wherein
the selection circuit:
outputs data of the phase shift during a period of time other than the first period of time after the time of detection of the over-change; and
outputs data of the phase shift at a time a second time before, the second time being longer than the first time, as data of the phase shift before change during the first period of time after the time of detection of the over-change.

4. The clock data recovery control circuit according to claim 2, wherein
the change detection circuit latches and holds the phase shift at the time the first time before when detecting that the calculated amount of change is smaller than a first threshold value, and outputs the held phase shift as the phase shift before change.

5. The clock data recovery control circuit according to claim 2, wherein
the storage circuit includes:
a divider circuit that generates a divided clock of a base clock in synchronization with the change in the phase shift; and
latch circuits in a plurality of stages formed so that the phase shift is input in the initial stage and an output of the initial stage is input in the second stage, an output of the second stage is input in the third stage, and latching in each stage is performed in synchronization with the divided clock or a reversed clock of the divided clock, the change detection circuit calculates a difference between the output in the latch circuit in the plurality of stages other than the initial stage and the current phase shift as the amount of change, and
the selection circuit outputs the output in the stage after the stage that is used by the change detection circuit to calculate the amount of change of the latch circuits in the plurality of stages as the phase shift during the first period of time after the time of detection of the over-change.

6. The clock data recovery control circuit according to claim 2, wherein
the selection circuit changes the length of the first period of time during which the selection circuit outputs the phase shift before change in accordance with the value of the amount of change when the amount of change detected by the change detection circuit exceeds the limit.

7. The clock data recovery control circuit according to claim 1, further comprising a storage circuit that stores the phase shift, wherein
the change detection circuit:
includes a counter that adds or subtracts phase data indicating the delayed phase or advanced phase of the detected input data during the first period of time; and
determines that the over-change has occurred when an absolute value of a count value of the counter exceeds a threshold value.

8. A clock data recovery circuit comprising:
a phase adjustment circuit that adjusts a phase of a multiphase reference clock to a phase corresponding to phase control data and generates a multiphase-adjusted clock;
a latch circuit that takes in input data with the multiphase-adjusted clock;
a de-serializer that converts a latched signal into parallel data; and
a clock data recovery control circuit that detects a phase shift from the parallel data and generates the phase control data based on the detected phase shift, wherein, the clock data recovery control circuit includes:
a change detection circuit that detects an over-change in the phase shift based on an amount of a change of the phase shift during a first period of time; and
a selection circuit that outputs a phase shift before change, which is the phase shift before the time of detection of the over-change, as the phase shift during the first period of time at the time of detection of the over-change, during the first period of time after the time of detection of the over-change, the phase control data being generated based on the phase shift before change during the first period of time after the time of detection of the over-change.

9. A clock data recovery control method of detecting a phase shift of input data that is taken in with a phase-adjusted clock and generating phase control data that controls a phase of the clock based on the detected phase shift, the method comprising: after an initial lock is completed,
detecting a current phase shift;
updating and holding a phase shift at a time a second time before the current time;
calculating a difference between the phase shift at a time a first time before the current time, the first time being shorter than the second time, and the current phase shift as an amount of change, and comparing the amount of change with a limit value of the phase shift per the first time;

performing a clock data recovery normal operation to generate the phase control data based on the current phase shift in a case where the amount of change does not exceed the limit value, suspending the clock data recovery normal operation in a case where the amount of change exceeds the limit value, and generating the phase control data based on the phase shift at the time the second time before during a first period of time; and resuming, after the first period of time elapses, the clock data recovery normal operation to generate the phase control data based on the current phase shift.

10. The clock data recovery control method according to claim 9, wherein the limit value is set from a maximum changeable value and a necessary amount of change by calculating the maximum changeable value of the phase shift per the first time from a setting of an object to be controlled and by calculating the necessary amount of change in the phase shift per the first time from control quality of the object to be controlled.

* * * * *